United States Patent
Kawamoto

(10) Patent No.: US 10,389,348 B2
(45) Date of Patent: Aug. 20, 2019

(54) TEMPERATURE PROTECTION DEVICE

(71) Applicant: DENSO CORPORATION, Kariya, Aichi-pref. (JP)

(72) Inventor: Ippei Kawamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 315 days.

(21) Appl. No.: 15/517,327

(22) PCT Filed: Oct. 13, 2015

(86) PCT No.: PCT/JP2015/005182
§ 371 (c)(1),
(2) Date: Apr. 6, 2017

(87) PCT Pub. No.: WO2016/063495
PCT Pub. Date: Apr. 28, 2016

(65) Prior Publication Data
US 2017/0294908 A1    Oct. 12, 2017

(30) Foreign Application Priority Data
Oct. 22, 2014    (JP) .................................. 2014-215723

(51) Int. Cl.
*H03K 17/00*    (2006.01)
*H03K 17/082*    (2006.01)
(Continued)

(52) U.S. Cl.
CPC ......... *H03K 17/0822* (2013.01); *H01L 27/04* (2013.01); *H01L 29/78* (2013.01);
(Continued)

(58) Field of Classification Search
CPC ............. H03K 17/0822; H03K 17/284; H03K 2017/0806; H01L 27/04; H01L 29/78; H02M 1/32; H02M 2001/327
See application file for complete search history.

(56) References Cited

U.S. PATENT DOCUMENTS

2004/0094844 A1    5/2004    Nishino
2005/0105233 A1    5/2005    Hisada et al.
(Continued)

FOREIGN PATENT DOCUMENTS

JP    2001-313364 A    11/2001

*Primary Examiner* — Pete T Lee
(74) *Attorney, Agent, or Firm* — Posz Law Group, PLC

(57) ABSTRACT

A temperature protection device includes temperature detection devices detecting the temperatures of switching elements and a control device controlling the switching elements. The control device stops driving of a first switching element the temperature of which rises to an overheat detection temperature and resumes the driving of the first switching element when the temperature of the first switching element drops to a return temperature. The control device controls timing of resuming the driving of the first switching element so that an undriven time period of the first switching element is longer in a case where at least one of the switching elements other than the first switching element is in a high load state when the temperature of the first switching element reaches the overheat detection temperature than that in a case where all the switching elements other than the first switching element are in a low load state.

6 Claims, 9 Drawing Sheets

(51) Int. Cl.
  *H01L 27/04* (2006.01)
  *H01L 29/78* (2006.01)
  *H03K 17/284* (2006.01)
  *H02M 1/32* (2007.01)
  *H03K 17/08* (2006.01)

(52) U.S. Cl.
  CPC ............ *H02M 1/32* (2013.01); *H03K 17/284* (2013.01); *H02M 2001/327* (2013.01); *H03K 2017/0806* (2013.01)

(56) References Cited

U.S. PATENT DOCUMENTS

| | | | | |
|---|---|---|---|---|
| 2012/0219033 | A1* | 8/2012 | Tanimura | ............... G01K 3/005 374/1 |
| 2013/0106470 | A1* | 5/2013 | Takagiwa | ............. H03K 17/168 327/109 |
| 2013/0332750 | A1* | 12/2013 | Souma | ..................... H02H 3/08 713/300 |

* cited by examiner

TEMPERATURE PROTECTION DEVICE

CROSS REFERENCE TO RELATED APPLICATIONS

This application is a U.S. national stage of International Patent Application No. PCT/JP2015/005182 filed on Oct. 13, 2015 and is based on Japanese Patent Application No. 2014-215723 filed on Oct. 22, 2014, the disclosure of which is incorporated herein by reference.

TECHNICAL FIELD

The present disclosure relates to a temperature protection device for plural switching devices included in a same package.

BACKGROUND ART

The temperature protection device disclosed in Patent Literature 1 has been known as a temperature protection device for plural switching elements included in a same package.

According to the temperature protection device, when the temperature of any of the switching elements rises to an overheat detection temperature (threshold temperature), driving of the switching element (hereinafter referred to as a "first switching element") is stopped. At the same time, the overheat detection temperature for a switching element (hereinafter referred to as a "second switching element") disposed in a location thermally affected by the first switching element is switched to a higher temperature.

PRIOR ART LITERATURE

Patent Literature

Patent Literature 1: JP 2004-140094 A

SUMMARY OF INVENTION

When the temperature of a switching element drops to a predetermined return temperature lower than the overheat detection temperature, driving of the switching element is resumed. Therefore, when a load short-circuit occurs in the first switching element, driving of the first switching element is repeatedly stopped and resumed. When, in such a state, the second switching element is being driven, the stopping of the driving of the first switching element causes the temperature of the second switching element to drop. However, as the second switching element is being driven, dropping of the temperature of the second switching element is slower than dropping of the temperature of the first switching element. Therefore, while driving of the first switching element is repeatedly stopped and resumed, the temperature of the second switching element gradually rises and eventually reaches the overheat detection temperature having been switched to. Thus, even after the overheat detection temperature is switched to a higher temperature, driving of the second switching element operating in normal condition is possibly stopped.

An object of the present disclosure is to provide a temperature protection device capable of restricting driving of a switching element operating in normal condition from being stopped when a load short-circuit has occurred.

According to an embodiment of the present disclosure, a temperature protection device is for plural switching elements which are included in a same package and which drive mutually different loads. The temperature protection device includes temperature detection devices to detect temperatures of the switching elements and a control device to control each of the switching elements. The control device has an overheat detection temperature and a return temperature set in the control device for each of the switching elements. The overheat detection temperature is for detecting an overheated state of a corresponding switching element and the return temperature is for resuming driving a corresponding switching element driving of which has been stopped due to overheating. The control device stops, when the temperature of a first switching element that is any of the switching elements rises to the corresponding overheat detection temperature, driving of the first switching element and resumes, when the temperature of the first switching element drops to the corresponding return temperature, driving of the first switching element.

The control device further controls timing of resuming the driving of the first switching element such that, when, upon reaching by the temperature of the first switching element the corresponding overheat detection temperature, at least one of the switching elements other than the first switching element is in a high load slate with a higher load than in a low load state, an undriven time period of the first switching element from a time the driving of the first switching element due to overheating is stopped to a time the driving of the first switching element is resumed is longer than that when all the switching elements other than the first switching element are in the low load state.

According to the above embodiment, when at least one of the switching elements other than the first switching element is in a high-load state, the undriven time period of the first switching element is made long. This makes it possible to restrict the temperature of a switching element in a high-load state, i.e. in normal operating condition, from reaching the overheat detection temperature as a result of occurrence of a load short-circuit in the first switching element and causing the normally operating switching element to enter an undriven state.

BRIEF DESCRIPTION OF DRAWINGS

The above and other objects, features and advantages of the present disclosure will become more apparent from the following detailed description made with reference to the accompanying drawings, in which like parts are designated by like reference numbers and in which.

DESCRIPTION OF EMBODIMENTS

In the following, embodiments of the present disclosure will be described based on drawings. Elements common or related between the following embodiments will be assigned with identical symbols.

First Embodiment

First, based on FIG. 1, an outline configuration of a semiconductor device to which a temperature protection device according to the present embodiment is applied will be described.

Figure 1:
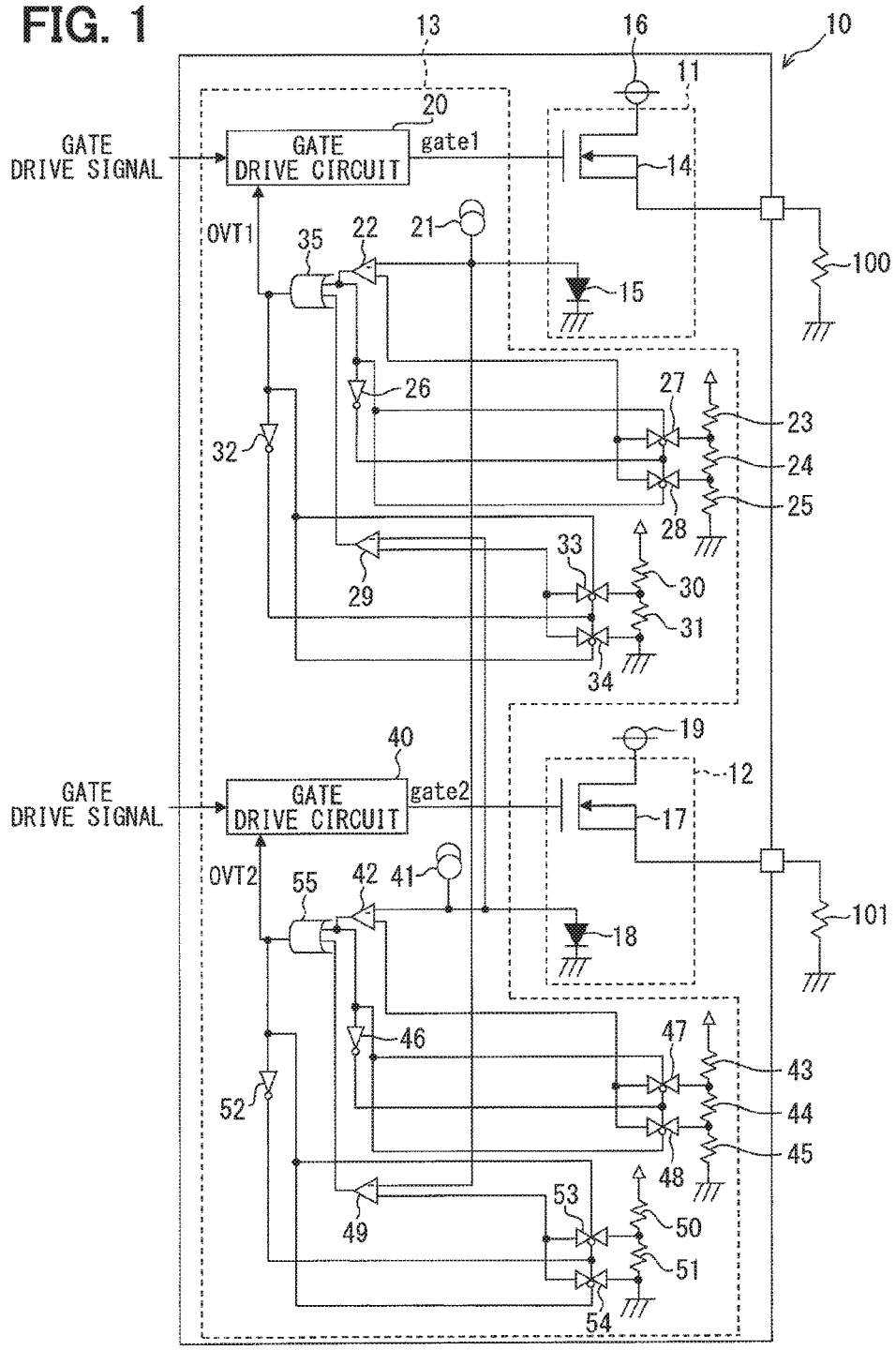
FIG. 1 is a diagram showing an outline configuration of a semiconductor device applied with a temperature protection device according to a first embodiment.

A semiconductor device 10 shown in FIG. 1 has semiconductor chips 11, 12 and 13 included in a same package. For example, these semiconductor chips 11, 12 and 13 are integrally resin-molded. At least, semiconductor chips 11 and 12 are located to be thermally affected by each other.

In the semiconductor chip 11, a first switching element 14 and a first thermosensor 15 are formed. The first switching element 14 conducts electricity to a load 100 or cuts off the electric conduction. The first switching element 14 may be, for example, a MOSFET or an IGBT. In the present embodiment, the first switching element 14 is an n-channel type MOSFET. The first switching element 14 is located between a power supply 16 and the load 100, namely, on the high side with respect to the load 100.

The first thermosensor 15 is formed on the same chip as the first switching element 14 so as to detect the temperature of the first switching element 14. In the present embodiment, the first thermosensor 15 is a diode. In the following, the first switching element 14 may also be referred to as the "switching element 14" and the first thermosensor 15 may also be referred to as the "thermosensor 15."

On the semiconductor chip 12, a second switching element 17 and a second thermosensor 18 are formed. The second switching element 17 conducts electricity to a load 101, different from the load 100 driven by the first switching element 14, or cuts off the electric conduction. The second switching element 17 may be, for example, a MOSFET or an IGBT. In the present embodiment, the second switching element 17 is an n-channel type MOSFET. The second switching element 17 is located between a power supply 19 and the load 101, namely, on the high side with respect to the load 101.

The second thermosensor 18 is formed on the same chip as the second switching element 17 so as to detect the temperature of the second switching element 17. In the present embodiment, the second thermosensor 18 is a diode. In the following, the second switching element 17 may also be referred to as the "switching element 17" and the second thermosensor 18 may also be referred to as the "thermosensor 18." The thermosensors 15 and 18 are equivalent to temperature detection devices.

The semiconductor chip 13 is a circuit chip on which control circuits to control the switching elements 14 and 17 are formed. The semiconductor chip 13 includes, as a control part to control driving of the first switching element 14, a gate drive circuit 20, a constant current source 21, comparators 22 and 29, resistors 23 to 25, 30 and 31, transfer gates 27, 28, 33 and 34, NOT gates 26 and 32, and an OR gate 35.

The gate drive circuit 20 outputs, based on a gate drive signal (digital signal) inputted from a microcomputer, not shown, a gate 1 signal (analog signal) to the gate electrode of the first switching element 14. When a H-level signal is inputted from the OR gate 35, the gate drive circuit 20 outputs, requiring no gate drive signal, a signal (L-level signal) to turn the first switching element 14 off as a gate 1 signal. On the other hand, when a L-level signal is inputted from the OR gate 35, the gate drive circuit 20 outputs, in accordance with a gate drive signal, a gate 1 signal. In the present embodiment, simple on-off control is performed in which the first switching element 14 is turned on when powering the load 100 on and is turned off when powering the load 100 off, so that, when a L-level signal is inputted from the OR gate 35, the gate drive circuit 20 outputs a signal (H-level signal) to turn the first switching element 14 on.

The constant current source 21 supplies a constant current to the first thermosensor 15. The diode forming the first thermosensor 15 is connected, on the cathode side, to ground.

The comparator 22 has an inverting input terminal connected with the anode of the diode forming the first thermosensor 15 and a non-inverting input terminal to which a reference voltage is inputted. As the reference voltage, a voltage corresponding to an overheat detection temperature being described later and a voltage corresponding to the first return temperature can be switchably set.

The Vf of a diode is temperature-dependent and is higher at lower temperature and is lower at higher temperature. The comparator 22 outputs a L-level signal when the temperature of the first switching element 14 detected at the first thermosensor 15 is lower than the overheat detection temperature and outputs a H-level signal when the detected temperature is higher than the overheat detection temperature. Also, the comparator 22 outputs a L-level signal when the detected temperature is lower than the first return temperature and outputs a H-level signal when the detected temperature is higher than the first return temperature.

The resistors 23 to 25 are connected in series between the power supply and ground. The resistors 23 to 25 are connected in the order of resistors 23, 24 and 25 from the power supply side. The supply voltage is divided by the resistors 23 to 25.

The NOT gate 26 is connected to the output terminal of the comparator 22 and outputs the output signal of the comparator 22 after inverting the signal. The transfer gates 27 and 28 are each a CMOS-type transfer gate in which an n-channel type MOSFET and a p-channel type MOSFET are combined. A transfer gate is also called a transmission gate and a MOS switch.

The n-channel side gate of the transfer gate 27 receives the output signal of the comparator 22 and the p-channel side gate receives the signal inverted at the NOT gate 26. The input terminal of the transfer gate 27 is connected to the connection point between the resistors 23 and 24 and the output terminal is connected to the non-inverting input terminal of the comparator 22.

The p-channel side gate of the transfer gate 28 receives the output signal of the comparator 22 and the n-channel side gate receives the signal inverted at the NOT gate 26. The input terminal of the transfer gate 28 is connected to the connection point between the resistors 24 and 25 and the output terminal is connected to the non-inverting input terminal of the comparator 22.

The output signal of the comparator 22 stays at L level until the temperature of the first switching element 14 reaches the overheat detection temperature (175° C.). This causes the output of the NOT gate 26 to be at H level, the transfer gale 28 to be on and the transfer gate 27 to be off. Hence, the voltage at the connection point between the resistors 24 and 25 is inputted as a reference voltage to the non-inverting input terminal of the comparator 22. The potential at the connection point between the resistors 24 and 25 has been set to a voltage corresponding to the overheat detection temperature (175° C.).

When the temperature of the first switching element 14 reaches (or exceeds) the overheat detection temperature, the output signal of the comparator 22 becomes H level. This causes the output of the NOT gate 26 to become L level, the transfer gate 27 to turn on and the transfer gate 28 to turn off. As a result, the reference voltage for the comparator 22 is switched to the voltage at the connection point between the resistors 23 and 24. The voltage at the connection point between the resistors 23 and 24 has been set to a voltage corresponding to the first return temperature. In the present embodiment, the first return temperature is 150° C.

The output signal of the comparator 22 stays at H level until the temperature of the first switching element 14 drops to the first return temperature. This causes the transfer gate 27 to stay on and the transfer gate 28 to stay off. As a result, the voltage at the connection point between the resistors 24 and 25 is set as the reference voltage for the comparator 22. When the temperature of the first switching element 14 drops to the first return temperature (or below the first return temperature), the output signal of the comparator 22 becomes L level. This causes the transfer gate 28 to turn on and the transfer gate 27 to turn off. As a result, the reference voltage for the comparator 22 is switched to the voltage at the connection point between the resistors 24 and 25.

As described above, a reference voltage source to supply a reference voltage to the comparator 22 is configured including the resistors 23 to 25, NOT gate 26, and transfer gates 27 and 28. The reference voltage source can be switchably set to a voltage corresponding to the overheat detection temperature or the first return temperature.

The comparator 29 has an inverting input terminal connected with the anode of the diode forming the second thermosensor 18 and a non-inverting input terminal to which a reference voltage is inputted. As the reference voltage, ground potential being described later and a voltage corresponding to the second return temperature can be switchably set. The comparator 29 outputs a L-level signal when the temperature of the second switching element 17 detected at the second thermosensor 18 is lower than the second return temperature and outputs a H-level signal when the detected temperature is higher than the second return temperature.

The resistors 30 and 31 are connected in series between the power supply and ground. They are connected in the order of resistors 30 and 31 from the power supply side. The supply voltage is divided by the resistors 30 and 31.

The NOT gate 32 is connected to the output terminal of the OR gate 35 and outputs the output signal of the OR gate 35 after inverting the signal. The transfer gates 33 and 34 are CMOS type transfer gates.

The n-channel side gate of the transfer gate 33 receives the output signal of the OR gate 35 and the p-channel side gate receives the signal inverted at the NOT gate 32. The input terminal of the transfer gate 33 is connected to the connection point between the resistors 30 and 31 and the output terminal is connected to the non-inverting input terminal of the comparator 29.

The p-channel side gate of the transfer gate 34 receives the output signal of the OR gate 35 and the n-channel side gate receives the signal inverted at the NOT gate 32. The input terminal of the transfer gate 34 is connected to ground and the output terminal is connected to the non-inverting input terminal of the comparator 29.

The OR gate 35 outputs, based on the outputs of the two comparators 22 and 29, an OVT1 signal to the gate drive circuit 20. The OR gate 35 outputs a L-level signal only when the outputs of the comparators 22 and 29 are both at L-level; otherwise the OR gate 35 outputs a H-level signal.

When the output signal of the OR gate 35 is at L level, namely, when the output signals of the comparators 22 and 29 are both at L level, the output of the NOT gate 32 becomes H level, the transfer gate 34 turns on and the transfer gate 33 turns off. As a result, the ground potential is inputted as a reference voltage to the non-inverting input terminal of the comparator 29. During the period after the temperature of the first switching element 14 reaches the first return temperature until the temperature of the first switching element 14 reaches the overheat detection temperature, the output signal of the comparator 22 stays at L level. During the period, the output signal of the OR gate 35 stays at L level. Thus, the comparator 29 is configured not to detect an overheat.

When the temperature of the first switching element 14 reaches the overheat detection temperature, the output signal of the comparator 22 becomes H level and the output signal of the OR gate 35 also becomes H level. The output signal of the OR gate 35 stays at H level during the period after the temperature of the first switching element 14 reaches the overheat detection temperature until the temperature drops to the first return temperature. This causes the output of the NOT gate 32 to be at L level, the transfer gate 33 to be on, and the transfer gate 34 to be off. Hence, the reference voltage for the comparator 29 switches to the voltage at the connection point between the resistors 30 and 31. The voltage at the connection point between the resistors 30 and 31 has been set to a voltage corresponding to the second return temperature that is lower than the first return temperature. In the present embodiment, the second return temperature is 135° C.

The output signal of the comparator 29 stays at H level until the temperature of the second switching element 17 drops to the second return temperature. Even after the temperature of the first switching element 14 drops to the first return temperature (150° C.) and the output signal of the comparator 22 becomes L level, the output signal of the comparator 29 stays at H level until the temperature of the second switching element 17 drops to the second return temperature.

When the temperature of the second switching element 17 drops to the second return temperature (or below the second return temperature), the output signal of the comparator 29 becomes L level. Since the output signals of the comparators 22 and 29 both become L level, the output signal of the OR gate 35 becomes L level. As a result, the transfer gate 34 turns on and the transfer gate 33 turns off. This causes the reference voltage for the comparator 29 to switch to the ground potential.

As described above, a reference voltage source to supply a reference voltage to the comparator 29 is configured including the resistors 30 and 31, NOT gate 32, and transfer gates 33 and 34. The reference voltage source can be switchably set to a voltage corresponding to the second return temperature or the ground potential.

The semiconductor chip 13 includes, as a control part to control driving of the second switching element 17, a gate drive circuit 40, a constant current source 41, comparators 42 and 49, resistors 43 to 45, 50 and 51, transfer gates 47, 48, 53 and 54, NOT gates 46 and 52, and an OR gate 55.

The gate drive circuit 40 outputs, based on a gate drive signal (digital signal) inputted from a microcomputer, not shown, a gate 2 signal (analog signal) to the gate electrode of the second switching element 17. When a H-level signal is inputted from the OR gate 55, the gate drive circuit 40 outputs, requiring no gate drive signal, a signal (L-level signal) to turn the second switching element 17 off as a gate 2 signal. On the other hand, when a L-level signal is inputted from the OR gate 55, the gate drive circuit 40 outputs, in accordance with a gate drive signal, a gate 2 signal. In the present embodiment, simple on-off control is performed in which the second switching element 17 is turned on when powering the load 101 on and is turned off when powering the load 101 off, so that, when a L-level signal is inputted from the OR gate 55, the gate drive circuit 40 outputs a signal (H-level signal) to turn the second switching element 17 on.

The constant current source 41 supplies a constant current to the second thermosensor 18. The diode forming the second thermosensor 18 is connected, on the cathode side, to ground.

The comparator 42 has an inverting input terminal connected with the anode of the diode forming the second thermosensor 18 and a non-inverting input terminal to which a reference voltage is inputted. As the reference voltage, a voltage corresponding to an overheat detection temperature being described later and a voltage corresponding to the first return temperature can be switchably set. The comparator 42 outputs a L-level signal when the temperature of the second switching element 17 detected at the second thermosensor 18 is lower than the overheat detection temperature and outputs a H-level signal when the detected temperature is higher than the overheat detection temperature. Also, the comparator 42 outputs a L-level signal when the detected temperature is lower than the first return temperature and outputs a H-level signal when the detected temperature is higher than the first return temperature.

The resistors 43 to 45 are connected in series between the power supply and ground. They are connected in the order of resistors 43, 44 and 45 from the power supply side. The supply voltage is divided by the resistors 43 to 45.

The NOT gate 46 is connected to the output terminal of the comparator 42 and outputs the output signal of the comparator 42 after inverting the signal. The transfer gates 47 and 48 are each a CMOS-type transfer gate. The n-channel side gate of the transfer gate 47 receives the output signal of the comparator 42 and the p-channel side gate receives the signal inverted at the NOT gate 46. The input terminal of the transfer gate 47 is connected to the connection point between the resistors 43 and 44 and the output terminal is connected to the non-inverting input terminal of the comparator 42.

The p-channel side gate of the transfer gate 48 receives the output signal of the comparator 42 and the n-channel side gate receives the signal inverted at the NOT gate 46. The input terminal of the transfer gate 48 is connected to the connection point between the resistors 44 and 45 and the output terminal is connected to the non-inverting input terminal of the comparator 42.

The output signal of the comparator 42 stays at L level until the temperature of the second switching element 17 reaches the overheat detection temperature. This causes the output of the NOT gate 46 to be at H level, the transfer gate 48 to be on and the transfer gate 47 to be off. Hence, the voltage at the connection point between the resistors 44 and 45 is inputted as a reference voltage to the non-inverting input terminal of the comparator 42. The potential at the connection point between the resistors 44 and 45 has been set to a voltage corresponding to the overheat detection temperature. The overheat detection temperature has been set to be the same as the overheat detection temperature (175° C.) for the first switching element 14.

When the temperature of the second switching element 17 reaches (or exceeds) the overheat detection temperature, the output signal of the comparator 42 becomes H level. This causes the output of the NOT gate 46 to become L level, the transfer gate 47 to turn on and the transfer gate 48 to turn off. As a result, the reference voltage for the comparator 42 is switched to the voltage at the connection point between the resistors 43 and 44. The voltage at the connection point between the resistors 43 and 44 has been set to a voltage corresponding to the first return temperature. The first return temperature has been set to be the same as the first return temperature for the first switching element 14 (150° C.).

The output signal of the comparator 42 stays at H level until the temperature of the second switching element 17 drops to the first return temperature. This causes the transfer gate 47 to stay on and the transfer gate 48 to stay off. Hence, the voltage at the connection point between the resistors 44 and 45 is set as the reference voltage for the comparator 42. When the temperature of the second switching element 17 drops to the first return temperature (or below the first return temperature), the output signal of the comparator 42 becomes L level. This causes the transfer gate 48 to turn on and the transfer gate 47 to turn off. As a result, the reference voltage for the comparator 42 is switched to the voltage at the connection point between the resistors 44 and 45.

As described above, a reference voltage source to supply a reference voltage to the comparator 42 is configured including the resistors 43 to 45, NOT gate 46, and transfer gates 47 and 48. The reference voltage source can be switchably set to a voltage corresponding to the overheat detection temperature or the first return temperature.

The comparator 49 has an inverting input terminal connected with the anode of the diode forming the first thermosensor 15 and a non-inverting input terminal to which a reference voltage is inputted. As the reference voltage, ground potential being described later and a voltage corresponding to the second return temperature can be switchably set. The comparator 49 outputs a L-level signal when the temperature of the first switching element 14 detected at the first thermosensor 15 is lower than the second return temperature and outputs a H-level signal when the detected temperature is higher than the second return temperature.

The resistors 50 and 51 are connected in series between the power supply and ground. They are connected in the order of resistors 50 and 51 from the power supply side. The supply voltage is divided by the resistors 50 and 51.

The NOT gate 52 is connected to the output terminal of the OR gate 55 and outputs the output signal of the OR gate 55 after inverting the signal. The transfer gates 53 and 54 are CMOS type transfer gates.

The n-channel side gate of the transfer gate 53 receives the output signal of the OR gate 55 and the p-channel side gate receives the signal inverted at the NOT gate 52. The input terminal of the transfer gate 53 is connected to the connection point between the resistors 50 and 51 and the output terminal is connected to the non-inverting input terminal of the comparator 49.

The p-channel side gate of the transfer gate 54 receives the output signal of the OR gate 55 and the n-channel side gate receives the signal inverted at the NOT gate 52. The input terminal of the transfer gate 54 is connected to ground and the output terminal is connected to the non-inverting input terminal of the comparator 49.

The OR gate 55 outputs, based on the outputs of the two comparators 42 and 49, an OVT2 signal to the gate drive circuit 40. The OR gate 55 outputs a L-level signal only when the outputs of the comparators 42 and 49 are both at L-level; otherwise the OR gate 55 outputs a H-level signal.

When the output signal of the OR gate 55 is at L level, namely, when the output signals of the comparators 42 and 49 are both at L level, the output of the NOT gate 52 becomes H level, the transfer gate 54 turns on and the transfer gate 53 turns off. As a result, the ground potential is inputted as a reference voltage to the non-inverting input terminal of the comparator 49. During the period after the temperature of the second switching element 17 reaches the first return temperature until the temperature of the second switching element 14 reaches the overheat detection temperature, the output signal of the comparator 42 stays at L level. During the period, the output signal of the OR gate 55 stays at L level. Thus, the comparator 49 is configured not to detect an overheat.

When the temperature of the second switching element 17 reaches the overheat detection temperature, the output signal of the comparator 42 becomes H level and the output signal of the OR gate 55 also becomes H level. The output signal of the OR gate 55 stays at H level during the period after the temperature of the second switching element 17 reaches the overheat detection temperature until the temperature drops to the first return temperature. Hence, the output of the NOT gate 52 becomes L level, the transfer gate 53 turns on, and the transfer gate 54 turns off. This causes the reference voltage for the comparator 49 to switch to the voltage at the connection point between the resistors 50 and 51. The voltage at the connection point between the resistors 50 and 51 has been set to a voltage corresponding to the second return temperature that is lower than the first return temperature. In the present embodiment, the second return temperature is the same as the second return temperature for the first switching element 14 (135° C.).

The output signal of the comparator 49 stays at H level until the temperature of the first switching element 14 drops to the second return temperature. Even after the temperature of the second switching element 17 drops to the first return temperature (150° C.) and the output signal of the comparator 42 becomes L level, the output signal of the comparator 49 stays at H level until the temperature of the first switching element 14 drops to the second return temperature.

When the temperature of the first switching element 14 drops to the second return temperature (or below the second return temperature), the output signal of the comparator 49 becomes L level. Since the output signals of the comparators 42 and 49 both become L level, the output signal of the OR gate 55 becomes L level. As a result, the transfer gate 54 turns on and the transfer gate 53 turns off. This causes the reference voltage for the comparator 49 to switch to the ground potential.

As described above, a reference voltage source to supply a reference voltage to the comparator 49 is configured including the resistors 50 and 51, NOT gate 52, and transfer gates 53 and 54. The reference voltage source can be switchably set to a voltage corresponding to the second return temperature or the ground potential.

In the present embodiment, the temperature protection device is configured with the thermosensors 15 and 18 and the circuit elements 20 to 35 and 40 to 55 formed in the semiconductor chip 13. The circuit elements 20 to 35 and 40 to 55 are equivalent to the control device.

Figure 2:
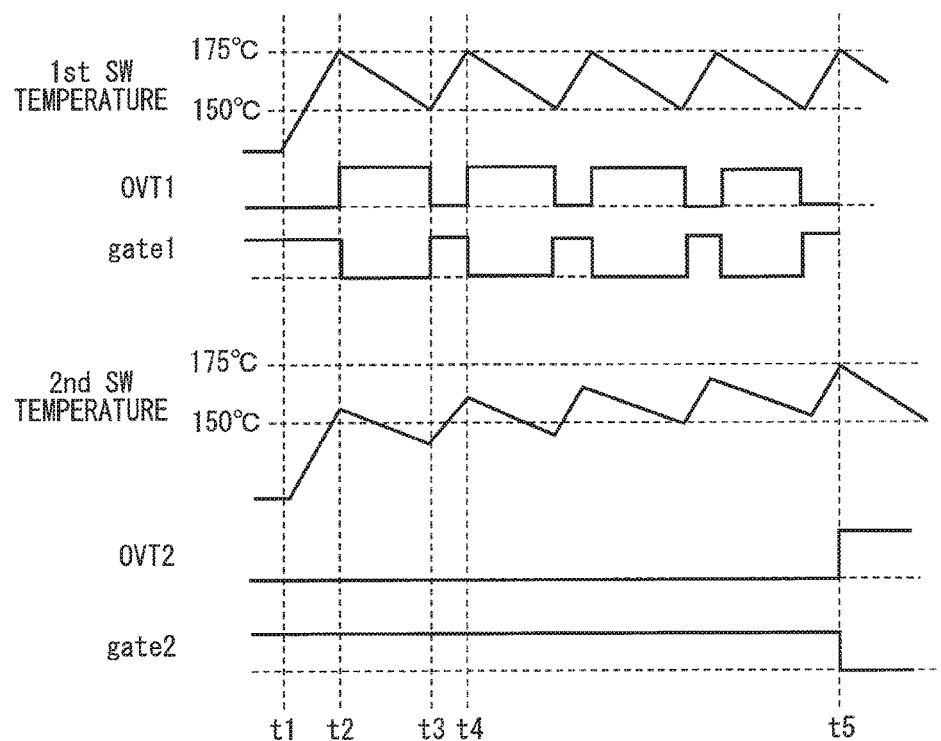
FIG. 2 is a timing chart representing operation of a semiconductor device of a comparative example.
Figure 3:
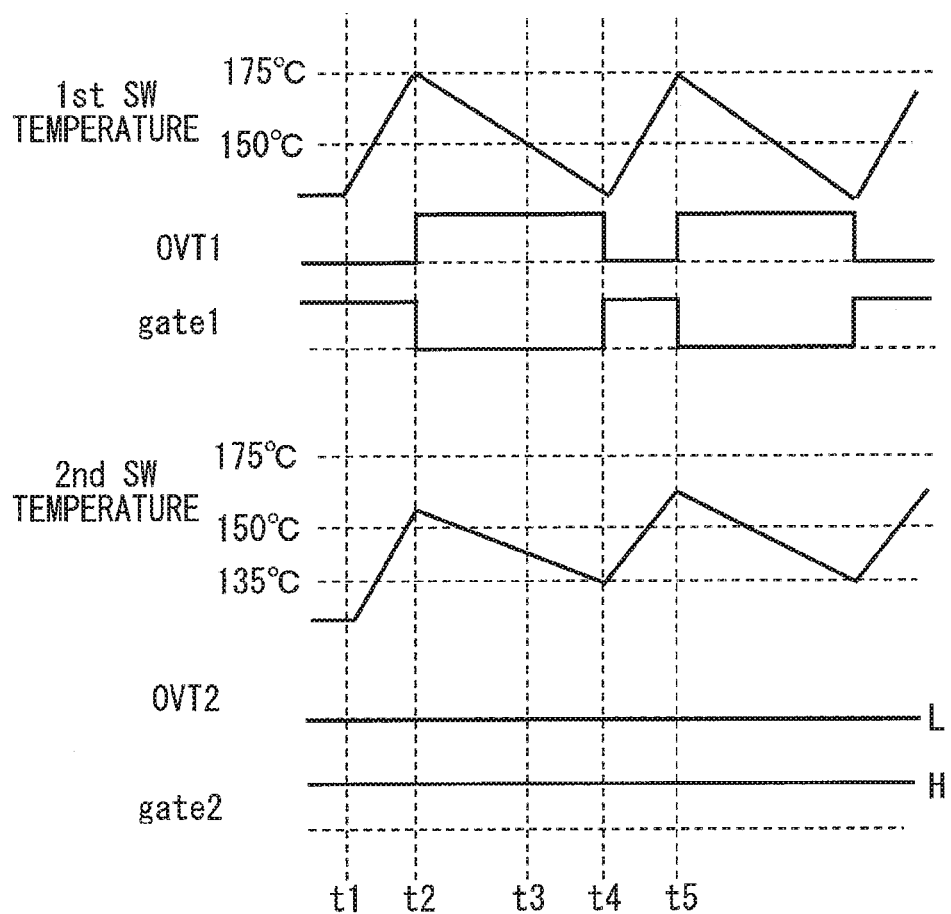
FIG. 3 is a timing chart representing operation of the semiconductor device according to the first embodiment.

Next, based on the timing charts shown in FIGS. 2 and 3, the operations of a semiconductor device as for a comparative example and the above-described semiconductor device 10 will be described. With respect to the example semiconductor device for comparison, elements which are identical to those of the semiconductor device 10 of the present embodiment will be referred to, though not particularly illustrated, by the same reference numerals as used in connection with the semiconductor device 10. FIGS. 2 and 3 each represent a case in which a load short-circuit has occurred on the first switching element 14 side. However, the operation to take place when a load short-circuit occurs on the second switching element 17 side is similar to the operation to take place when a load short-circuit occurs on the first switching element 14 side. In cases where the temperature of the second switching element 17 reaches the overheat detection temperature, the second switching element 17 is equivalent to the optional first switching element.

FIG. 2 represents the operation of the example semiconductor device for comparison. In FIG. 2, the first switching element 14 is denoted as "1st SW" and the second switching element 17 is denoted as "2nd SW." The example semiconductor device for comparison is configured identically to the semiconductor device 10 of the present embodiment less the circuit elements 29 to 35 and 49 to 55.

Therefore, in the comparative example, the outputs of the comparators 22 and 42 are inputted to the gate drive circuits 20 and 40, respectively. Hence, in FIG. 2, the output signals of the comparators 22 and 42 are denoted as "OVT1" and "OVT2," respectively. When the temperature of the first switching element 14 is lower than the first return temperature, the comparator 22 outputs a L-level signal to the gate drive circuit 20 causing the first switching element 14 to be driven. Similarly, when the temperature of the second switching element 17 is lower than the first return temperature, the comparator 42 outputs a L-level signal to the gate drive circuit 40 causing the second switching element 17 to be driven.

When, in a state where the switching elements 14 and 17 are being driven and the corresponding loads 100 and 101 are being fed with power, a load short-circuit occurs on the first switching element 14 side, for example, a short-circuit from the positive-side terminal of the load 100 to ground (at time t1) occurs, an overcurrent flows from the power supply 16 to the first switching element 14 to cause the temperature of the first switching element 14 to rapidly rise. As a result, the temperature of the second switching element 17 also rises by being thermally affected by the first switching element 14. For this, it is assumed that, at time t1, the temperature of the first switching element 14 is higher than the temperature of the second switching element 17.

When, at time t2, the temperature of the first switching element 14 reaches the overheat detection temperature (175° C.), the output signal (OVT1) of the comparator 22 becomes H level. As a result, the gate drive circuit 20 outputs a L-level signal as a gate 1 signal and driving of the first switching element 14 is stopped. Driving of the second switching element 17, on the other hand, is continued as the temperature of the second switching element 17 has not reached the overheat detection temperature.

After driving of the first switching element 14 is stopped, the temperature of the first switching element 14 drops. When the temperature of the first switching element 14 drops to the first return temperature (150° C.) at time t3, the output signal (OVT1) of the comparator 22 becomes L level.

As a result, the gate drive circuit 20 outputs a H-level signal as a gate 1 signal and driving of the first switching element 14 is resumed. During the period between time t2 and time t3, the second switching element 17 is kept driven, so that, compared with the first switching element 14, the temperature of the second switching element 17 drops slowly.

After time t3, the temperature of the first switching element 14 starts rising again. When the temperature of the first switching element 14 reaches the overheat detection temperature at time t4, driving of the first switching element 14 is stopped again.

As described above, driving of the first switching element 14 is repeatedly stopped and resumed. During that time, the second switching element 17 is kept driven, so that, even while driving of the first switching element 14 is stopped, the temperature of the second switching element 17 does not quickly drop. This allows, over a longer period of time, the temperature of the second switching element 17 to gradually rise. For example, the temperature of the second switching element 17 at each time when the temperature of the first switching element 14 has dropped to the first return temperature is gradually higher. This eventually allows the temperature of the second switching element 17 to reach, at time t5, the overheat detection temperature. As a result, driving of the second switching element 17 is stopped.

FIG. 3 represents the operation of the semiconductor device 10 of the present embodiment. When, in a state where the switching elements 14 and 17 are being driven and the corresponding loads 100 and 101 are being fed with power, a load short-circuit occurs on the first switching element 14 side (at time t1), an overcurrent flows from the power supply 16 to the first switching element 14 to cause the temperature of the first switching element 14 to rapidly rise. Note that, at time t1, the temperature of the first switching element 14 is assumed to be higher than the temperature of the second switching element 17. As a result, the temperature of the second switching element 17 also rises by being thermally affected by the first switching element 14.

When, at time t2, the temperature of the first switching element 14 reaches the overheat detection temperature (175° C.), the output signal of the comparator 22 becomes H level and the output signal OVT1 of the OR gate 35 also becomes H level. As a result, the gate drive circuit 20 outputs a L-level signal as a gate 1 signal and driving of the first switching element 14 is stopped. Driving of the second switching element 17, on the other hand, is continued as the temperature of the second switching element 17 has not reached the overheat detection temperature.

After driving of the first switching element 14 is stopped, the temperature of the first switching element 14 drops and reaches the first return temperature (150° C.) at time t3. At time t3, however, the temperature of the second switching element 17 has not dropped to the second return temperature (135° C.). Therefore, while the output signal of the comparator 22 becomes L level, the output signal of the comparator 29 stays at H level causing the output signal OVT1 of the OR gate 35 to also stay at H level.

When the temperature of the second switching element 17 further drops and reaches the second return temperature at time t4, the output signal of the comparator 29 becomes L level. As a result, the output signal OVT1 of the OR gate 35 becomes L level, causing the gate drive circuit 20 to output a H-level signal as a gate 1 signal and driving of the first switching element 14 to be resumed.

After time t4, the temperature of the first switching element 14 starts rising again. Subsequently, when the temperature of the first switching element 14 reaches the overheat detection temperature at time t5, driving of the first switching element 14 is stopped again. At this time, since the temperature of the second switching element 17 has not reached the overheat detection temperature, the second switching element 17 stays driven.

Subsequently, driving of the first switching element 14 is repeatedly stopped and resumed. In the present embodiment, however, driving of the first switching element 14 is not resumed until the temperature of the second switching element 17 drops to the second return temperature. Therefore, though the driving of the first switching element 14 is repeatedly stopped and resumed, when the temperature of the first switching element 14 has dropped to the first return temperature, the second switching element 17 is always at the same temperature (the second return temperature).

Note that the temperature of the second switching element 17 drops to the second return temperature (135° C.) faster when the second switching element 17 is in an undriven state than when the second switching element 17 is in an on state. Therefore, the undriven time period (off time) from when driving of the first switching element 14 is stopped due to overheating until when driving of the first switching element 14 is resumed can be made longer in the case where the second switching element 17 is in a driven state than that in the case where the second switching element 17 is in an undriven state. In the present embodiment, with regard to the switching elements 14 and 17, a driven state refers to an on state and an undriven state refers to an off state. The off state of the switching element 14 or 17 can also be referred to as a state in which driving of the switching element 14 or 17 is in a low-load state and the on state of the switching element 14 or 17 can also be referred to as a state in which driving of the switching element 14 or 17 is in a high-load state. The driven state of the switching element 14 or 17 can also be referred to as a state in which current is being applied to the corresponding load 100 or 101 and the undriven state of the switching element 14 or 17 can also be referred to as a state in which current application to the load 100 or 101 has been stopped.

Next, effects of the semiconductor device 10 (temperature protection device) of the present embodiment will be described.

According to the present embodiment, resumption of driving of the first switching element 14 which has been undriven due to overheating is determined not only based on comparison between the temperature of the first switching element 14 and the first return temperature (150° C.) but also based on comparison between the temperature of the second switching element 17 and the second return temperature (135° C.). When the second switching element 17 is in a driven state upon occurrence of a load short-circuit on the first switching element 14 side, the temperature of the second switching element 17 is higher than when the second switching element 17 is in an undriven state. Subsequently, driving of the first switching element 14 is resumed after the temperature of the second switching element 17 drops to the second return temperature. Therefore, the undriven time period from when driving of the first switching element 14 is stopped due to overheating until when driving of the first switching element 14 is resumed can be made longer in the case where the second switching element 17 is in a driven state than that in the case where the second switching element 17 is in an undriven state.

Thus, the temperature of the second switching element 17 in a driven state, i.e. in normal operating condition, can be restricted from reaching the overheat detection temperature due to occurrence of a load short-circuit on the first switching element 14 side and being caused to enter an undriven state. This applies also when a load short-circuit occurs on the second switching element 17 side.

Particularly, according to the present embodiment, the temperature of the second switching element 17 in which no load short-circuit has occurred is detected and dropping of the temperature of the second switching element to the predetermined second return temperature lower than the first return temperature determines the undriven time period of the first switching element 14. Therefore, the temperature of the second switching element 17 can be more effectively restricted from reaching the overheat detection temperature due to a load short-circuit on the first switching element 14 side and causing driving of the second switching element 17 to be stopped. This also applies when a load short-circuit occurs on the second switching element 17 side.

The above values of the overheat detection temperature, first return temperature and second return temperature are mere examples. The respective temperatures may be set to different values as long as the relationship of (overheat detection temperature <first return temperature > second return temperature) is satisfied.

Though in the present embodiment, the overheat detection temperature, first return temperature and second return temperature are common between the first switching element 14 and the second switching element 17, at least one of the overheat detection temperature, first return temperature and second return temperature may be different between the first switching element 14 and the second switching element 17.

Second Embodiment

In describing a second embodiment, the description of parts identical to those of the semiconductor device 10 (temperature protection device) of the first embodiment will be omitted, According to the first embodiment, for example, when resuming driving of the first switching element 14, the timing of driving resumption is controlled with the temperature of the second switching element 17 taken into account such that the undriven time period of the first switching element 14 is longer when the second switching element 17 is in a driven state than when the second switching element 17 is in an undriven state.

Figure 4:
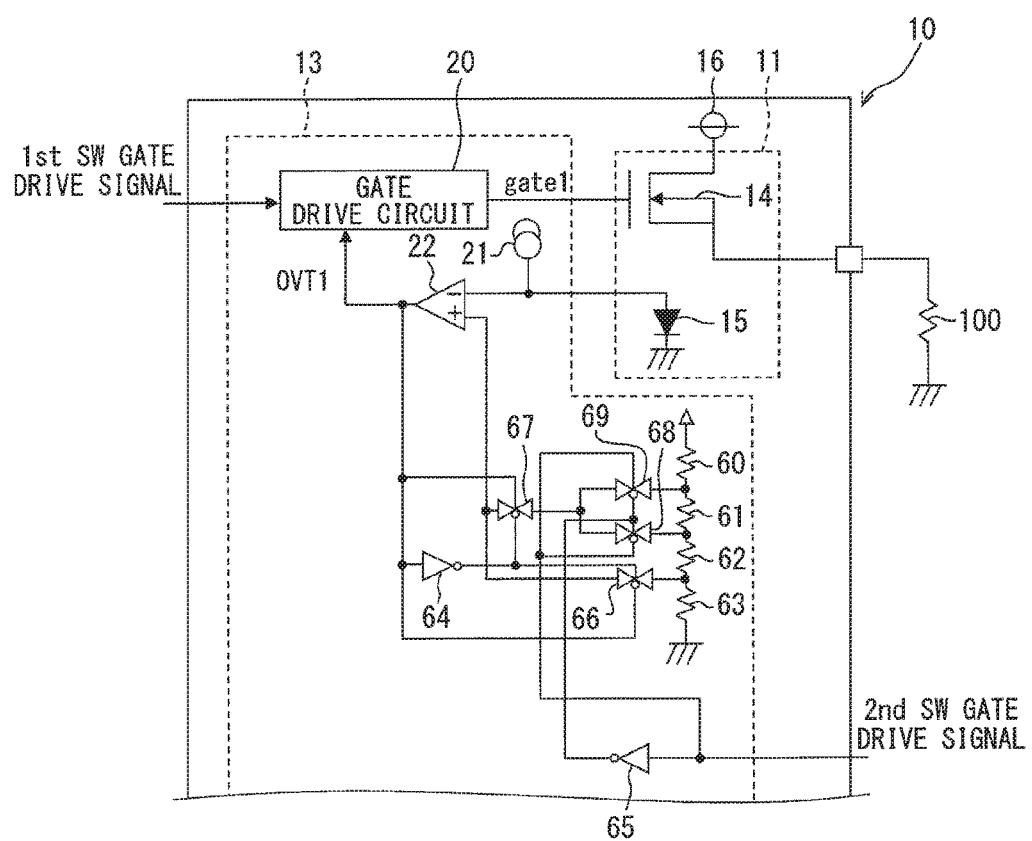
FIG. 4 is a diagram representing a portion of a semiconductor device applied with a temperature protection device according to a second embodiment.

In the present embodiment, control is made not based on the temperature of the second switching element 17 but by using a gate drive signal. FIG. 4 shows the configuration of a portion on the first switching element 14 side of the semiconductor device 10 of the present embodiment. In the following, an example case in which a load short-circuit occurs on the first switching element 14 side will be described. The other portion on the second switching element 17 side of the semiconductor device 10 is configured similarly to the portion on the first switching element 14 side shown in FIG. 4 and similar effects can be obtained also when a load short-circuit occurs on the second switching element 17 side. In FIG. 4, the gate drive signal for the first switching element 14 is denoted as "1st SW gate drive signal" and the gate drive signal for the second switching element 17 is denoted as "2nd SW gate drive signal." In the present embodiment, too, the switching elements 14 and 17 are simply on/off-controlled.

As in the first embodiment, the semiconductor chip 13 includes, as circuit elements on the first switching element 14 side, the gate drive circuit 20, constant-current source 21 and comparator 22. In addition, the semiconductor chip 13 also includes resistors 60 to 63, NOT gates 64 and 65, and transfer gates 66 to 69. Therefore, the control device is configured including circuit elements 20 to 22 and 60 to 69 formed in the semiconductor chip 13. The circuit elements 60 to 69 determine a reference voltage for the comparator 22.

The resistors 60 to 63 are connected in series between the power supply and ground. The resistors 60 to 63 are connected in the order of resistors 60, 61, 62 and 63 from the power supply side. The supply voltage is divided by the resistors 60 to 63.

The NOT gate 64 is connected to the output terminal of the comparator 22 and outputs the output signal of the comparator 22 after inverting the signal. Like the gate drive circuit 40, not shown, the NOT gate 65 receives a gate drive signal for the second switching element 17 and outputs the gate drive signal after inverting the signal.

The transfer gates 66 and 69 are each a CMOS-type transfer gate. The p-channel side gate of the transfer gate 66 receives the output signal of the comparator 22 and the n-channel side gate receives the signal inverted at the NOT gate 64. The input terminal of the transfer gate 66 is connected to the connection point between the resistors 62 and 63 and the output terminal is connected to the non-inverting input terminal of the comparator 22.

The n-channel side gate of the transfer gate 67 receives the output signal of the comparator 22 and the p-channel side gate receives the signal inverted at the NOT gate 64. The input terminal of the transfer gate 67 is connected to the output terminal of the transfer gates 68 and 69 and the output terminal is connected to the non-inverting input terminal of the comparator 22.

The p-channel side gate of the transfer gate 68 receives a gate drive signal for the second switching element 17 and the n-channel side gate receives the signal inverted at the NOT gate 65. The input terminal of the transfer gate 68 is connected to the connection point between the resistors 61 and 62 and the output terminal is connected to the input terminal of the transfer gate 67.

The n-channel side gate of the transfer gate 69 receives a gate drive signal for the second switching element 17 and the p-channel side gate receives the signal inverted at the NOT gate 65. The input terminal of the transfer gate 69 is connected to the connection point between the resistors 60 and 61 and the output terminal is connected to the input terminal of the transfer gate 67.

In the semiconductor device 10 (temperature protection device) configured as described above, the output signal OVT1 of the comparator 22 stays at L level until the temperature of the first switching element 14 reaches the overheat detection temperature (175° C.). This causes the output of the NOT gate 64 to be at H level, the transfer gate 66 to be on and the transfer gate 67 to be off. Hence, the voltage at the connection point between the resistors 62 and 63 is inputted to the non-inverting input terminal of the comparator 22 as a reference voltage. The potential at the connection point between the resistors 62 and 63 has been set to a voltage corresponding to the overheat detection temperature (175° C.).

The output signal OVT1 of the comparator 22 is inputted to the gate drive circuit 20. Until the overheat detection temperature is reached, the output signal OVT1 stays at L level as described above. When an L-level signal is received as the output signal OVT1, the gate drive circuit 20 outputs a gate 1 signal in accordance with the gate drive signal. In the present embodiment in which the first switching element 14 is simply on/off-controlled, when driving the load 100, a signal (H-level signal) to turn the first switching element 14 on is outputted.

When the temperature of the first switching element reaches the overheat detection temperature, the output signal of the comparator 22 becomes H level. As a result, the output of the NOT gate 64 becomes L level, the transfer gate 66 turns off and the transfer gate 67 turns on.

When, at this time, the second switching element 17 is in an undriven state, i.e. when the gate drive signal is at L level, the output of the NOT gate 65 becomes H level, the transfer gate 68 turns on and the transfer gate 69 turns off. As a result, the reference voltage for the comparator 22 switches to the voltage at the connection point between the resistors 61 and 62. The voltage at the connection point between the resistors 61 and 62 has been set to a voltage corresponding to a third return temperature. In the present embodiment, the third return temperature is 150° C.

When the second switching element 17 is in a driven state, i.e. when the gate drive signal is at H level, the output of the NOT gate 65 becomes L level, the transfer gate 68 turns off and the transfer gate 69 turns on. As a result, the reference voltage for the comparator 22 switches to the voltage at the connection point between the resistors 60 and 61. The voltage at the connection point between the resistors 60 and 61 has been set to a voltage corresponding to a fourth return temperature. The fourth return temperature is set to be lower than the third return temperature. In the present embodiment, the fourth return temperature is 135° C.

For example, when a load short-circuit occurs on the first switching element 14 side, an overcurrent flows through the first switching element 14 as described in connection with the first embodiment and the temperature of the first switching element 14 rapidly rises. In cases where the gate drive signal for the second switching element 17 is H level indicating that the second switching element 17 is in a driven state, driving of the first switching element 14 is resumed when the temperature of the first switching element 14 drops to the fourth return temperature. In cases where the gate driving signal for the second switching element 17 is L level indicating that the second switching element 17 is in an undriven state, driving of the first switching element 14 is resumed when the temperature of the first switching element 14 drops to the third return temperature.

As described above, according to the present embodiment, in cases where, when the temperature of the first switching element 14 reaches the overheat detection temperature, the gate drive signal for the second switching element 17 is at H level, a voltage corresponding to the fourth return temperature (135° C.) can be set as the reference voltage for the comparator 22. When the gate drive signal for the second switching element 17 is at L level, a voltage corresponding to the third return temperature (150° C.) can be set as the reference voltage for the comparator 22. Therefore, the undriven time period (off time) from when driving of the first switching element 14 is stopped due to overheating until when driving of the first switching element 14 is resumed can be made longer in the case where the second switching element 17 is in a driven state (high-load state) than that in the case where the second switching element 17 is in an undriven state (low-load state).

Thus, the temperature of the second switching element 17 in a driven state, i.e. in normal operating condition, can be restricted from reaching the overheat detection temperature due to occurrence of a load short-circuit on the first switching element 14 side and being caused to enter an undriven state. This applies also when a load short-circuit occurs on the second switching element 17 side.

The above values of the overheat detection temperature, third return temperature and fourth return temperature are mere examples. The respective temperatures may be set to different values as long as the relationship of (overheat detection temperature >third return temperature > fourth return temperature) is satisfied.

The overheat detection temperature, third return temperature and fourth return temperature may be common between the first switching element 14 and the second switching element 17 or, at least one of the overheat detection temperature, third return temperature and fourth return temperature may be different between the first switching element 14 and the second switching element 17.

Third Embodiment

In describing a third embodiment, the description of parts identical to those of the semiconductor device 10 (temperature protection device) of the second embodiment will be omitted.

According to the second embodiment, the timing of resuming driving of the first switching element 14 is controlled by changing the reference voltage (i.e. return temperature) for the comparator 22, for example, using the gate drive signal for the second switching element 17.

In the present embodiment, the timing of resuming driving the first switching element 14 is controlled, for example, by making the clock period different between when the second switching element 17 is in a driven state and when the second switching element 17 is in an undriven state based on the gate drive signal for the second switching element 17.

Figure 5:
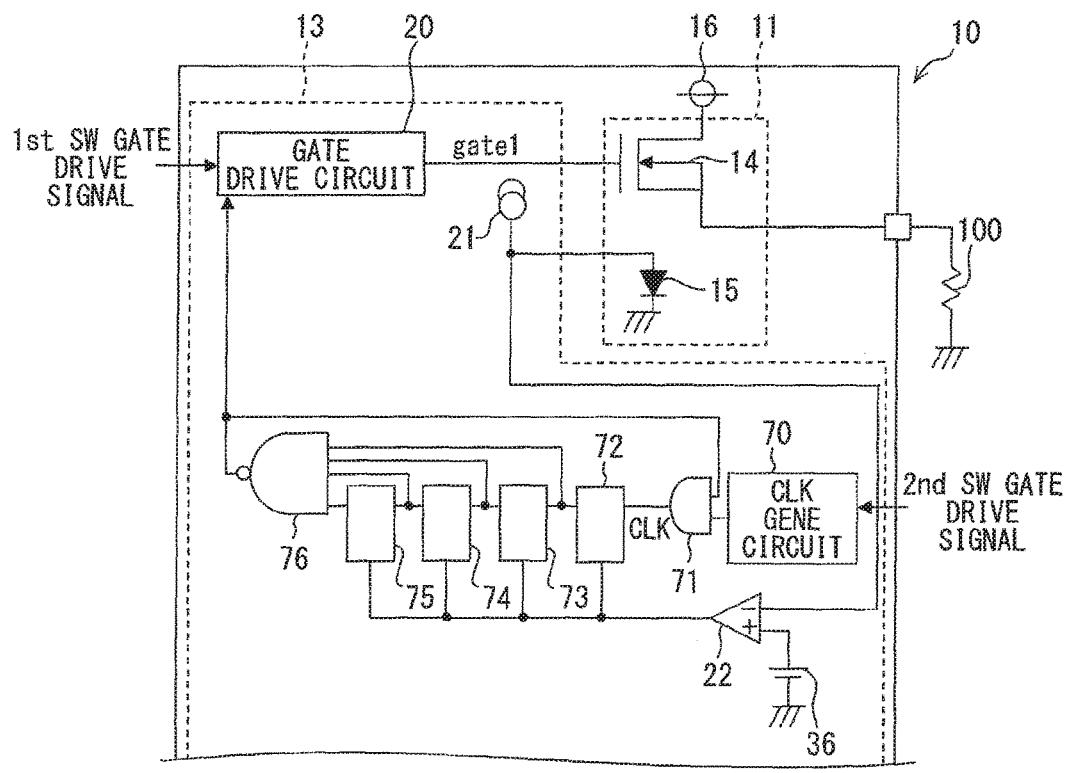
FIG. 5 is a diagram representing a portion of a semiconductor device applied with a temperature protection device according to a third embodiment.

FIG. 5 shows the configuration of a portion on the first switching element 14 side of the semiconductor device 10 of the present embodiment. In the following, an example case in which a load short-circuit occurs on the first switching element 14 side will be described. The other portion on the second switching element 17 side of the semiconductor device 10 is configured similarly to the portion on the first switching element 14 side shown in FIG. 5 and similar effects can be obtained also when a load short-circuit occurs on the second switching element 17 side. In FIG. 5, the gate drive signal for the first switching element 14 is denoted as "1st SW gate drive signal" and the gate drive signal for the second switching element 17 is denoted as "2nd SW gate drive signal." Also, a clock signal is denoted as "CLK." In the present embodiment, too, the switching elements 14 and 17 are simply on/off-controlled.

As in the first embodiment, the semiconductor chip 13 includes, as circuit elements on the first switching element 14 side, the gate drive circuit 20, constant-current source 21, comparator 22 and reference voltage source 36. The reference voltage source 36 has a hysteresis and, as in the first embodiment, can be switchably set to a voltage corresponding to an overheat detection temperature (e.g. 175° C.) or a voltage corresponding to a return temperature (e.g. 150° C.).

In addition, the semiconductor chip 13 also includes a clock generation circuit 70, an AND gate 71, flip-flops 72 to 75, and a NAND gate 76. Therefore, the control device is configured including circuit elements 20 to 23 and 70 to 76 formed in the semiconductor chip 13.

The clock generation circuit 70 generates clock signals. In the present embodiment, the clock generation circuit 70 generates clock signals of different periods depending on the state of the gate drive signal for the second switching element 17. To be specific, the clock signals generated when the gate drive signal is at H level (the element is in a driven state) have a longer period than the clock signals generated when the gate drive signal is at L level (the element is in an undriven state).

The AND gate 71 receives clock signals generated at the clock generation circuit 70 and the output of the NAND gate 76. When the output of the NAND gate 76 is at L level, the output signal of the AND gate 71 is at L level. When the output of the NAND gate 76 is at H level, the output level of the AND gate 71 depends on the clock signals.

The flip-flops 72 to 75 are T-type flip-flops and are also called toggle flip-flops. The clear terminal of each of the flip-flops 72 to 75 receives the output signal of the comparator 22. When the output signal of the comparator 22 is at H level, the flip-flops 72 to 75 are each kept in a reset state. When the output signal of the comparator 22 becomes L level, the flip-flops 72 to 75 are released from the reset state.

In cases where a voltage corresponding to the overheat detection temperature is set by the reference voltage source 36, the output signal of the comparator 22 becomes L level when the temperature of the first switching element 14 is lower than the overheat detection temperature or becomes H level when the temperature of the first switching element 14 is higher than the overheat detection temperature. In cases where the reference voltage source 36 is set to a voltage corresponding to a return temperature, the output signal of the comparator 22 becomes L level when the temperature of the first switching element 14 is lower than the return temperature or becomes H level when the temperature of the first switching element 14 is higher than the return temperature. Therefore, during the period from when the temperature of the first switching element 14 reaches the overheat detection temperature until when the temperature of the first switching element 14 drops to the return temperature, the output signal of the comparator 22 stays at H level and the flip-flops 72 to 75 stay in a reset state.

When a H-level signal is inputted from the NAND gate 76 to the AND gate 71, the clock signal generated at the clock generation circuit 70 is inputted to the first-stage flip-flop 72 via the AND gate 71 and the output of the first-stage flip-flop 72 is inputted to the next-stage flip-flop 73 and the NAND gate 76. The second-stage flip-flop 73 receives the output of the first-stage flip-flop 72 and the output of the second-stage flip-flop 73 is inputted to the next-stage flip-flop 74 and the NAND gate 76. The third-stage flip-flop 74 receives the output of the second-stage flip-flop 73 and the output of the third-stage flip-flop 74 is inputted to the next-stage flip-flop 75 and the NAND gate 76. The fourth-stage flip-flop 75 receives the output of the third-stage flip-flop 74 and the output of the fourth-stage flip-flop 75 is inputted to the NAND gate 76. Thus, the four stages of flip-flops make up a counter.

The NAND gate 76 outputs a L-level signal only when the output signals of the flip-flops 72 to 75 are all at H level; otherwise the NAND gate 76 outputs a H-level signal. When the output signal of the NAND gate 76 is at L level, the gate drive circuit 20 outputs a gate 1 signal in accordance with the gate drive signal.

Figure 6:
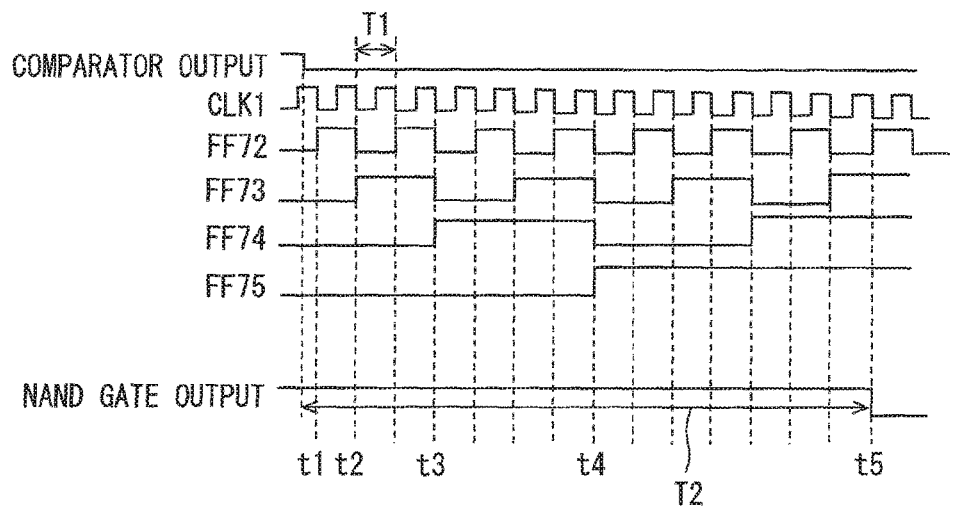
FIG. 6 is a timing chart representing a low-load state.
Figure 7:
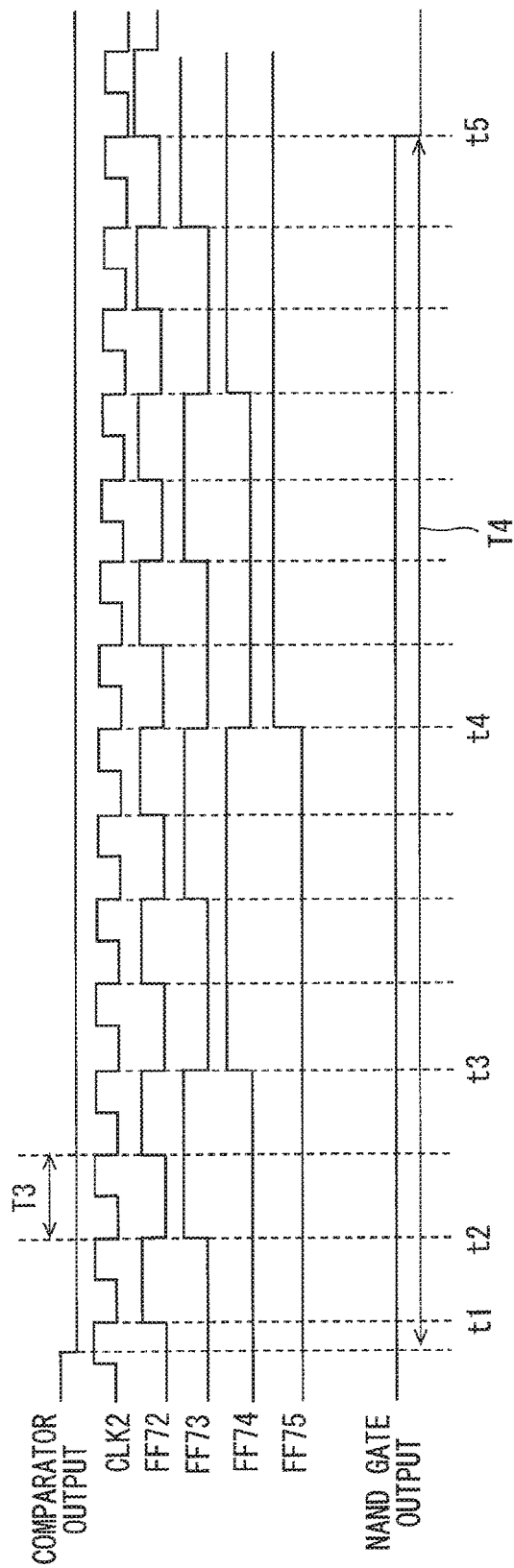
FIG. 7 is a timing chart representing a high-load state.

Next, based on FIGS. 6 and 7, how the undriven time period of the first switching element 14 from when the temperature of the first switching element 14 reaches the overheat detection temperature until when the element temperature drops to the return temperature is determined will be described. In FIGS. 6 and 7, each flip-flop is denoted as "FF" for convenience. Also, the clock signal generated with the second switching element 17 in an undriven state is denoted as "CLK1" and the clock signal generated with the second switching element 17 in a driven state is denoted as "CLK2."

FIG. 6 represents an undriven state (an off state) of the second switching element 17. The clock generation circuit 70 generates a clock signal with period T1. When the temperature of the first switching element 14 drops to the return temperature, the output signal of the comparator 22 changes from H level to L level. Also, the reference voltage of the reference voltage source 36 changes from a voltage corresponding to the return temperature to a voltage corresponding to the overheat detection temperature. When the output level of the comparator 22 changes to L level, the flip-flops 72 to 75 are released from a reset state.

Each of the flip-flops 72 to 75 toggles at each fall of the input signal. Therefore, at time t1 when the clock signal falls for the first time after the output of the comparator 22 changes to L level, the output signal of the flip-flop 72 rises, so that the output signal of the flip-flop 72 has a period two times the clock period T1. At time t2 when the output signal of the flip-flop 72 falls for the first time, the output signal of the second-stage flip-flip 73 rises, so that the output signal of the second-stage flip-flip 73 has a period two times the period of the output signal of the flip-flop 72, i.e. four times the clock period T1.

At time t3 when the output signal of the flip-flop 73 falls for the first time, the output signal of the third-stage flip-flop 74 rises, so that the output signal of the flip-flop 74 has a period two times the period of the output signal of the flip-flop 73, i.e. eight times the clock period T1. At time t4 when the output signal of the flip-flop 74 falls for the first time, the output signal of the fourth-stage flip-flop 75 rises, so that the output signal of the flip-flop 75 has a period two times the period of the output signal of the flip-flop 74, i.e. 16 times the clock period T1. When the output signals of the flip-flops 72 to 75 all become H level (at time t5), the output level of the NAND gate 76 becomes L level.

When the output signal of the NAND gate 76 becomes L level, that is, when counting by the flip-flops 72 to 75 ends (all at H level), the clock signal input is masked and the output signal of the AND gate 71 also becomes L level. When the temperature of the first switching element 14 reaches the overheat detection temperature, the output signal of the comparator 22 changes from L level to H level. Also, the reference voltage of the reference voltage source 36 switches to a voltage corresponding to the return temperature. Since the output level of the comparator 22 switches to H level, the flip-flops 72 to 75 enter a reset state.

When the flip-flops 72 to 75 are in a reset state, the output signals of the flip-flops 72 to 75 are at L level and the output signal of the NAND gate 76 is at H level. Therefore, the gate drive circuit 20 outputs a L-level signal as a gate 1 signal and driving of the first switching element 14 is stopped. Also, a H-level signal is inputted to the AND gate 71 causing the AND gate 71 to allow input of the clock signal from the clock generation circuit 70 to the flip-flop 72.

As described above, when the second switching element 17 is in an undriven state, the output of the comparator 22 becomes L level, then, after passage of a predetermined time period T2, the first switching element 14 enters a driven state. The predetermined time period T2 is very short (e.g. 1 msec) relative to a predetermined time period T4 being described later.

FIG. 7 represents a driven state (an on state) of the second switching element 17. The clock generation circuit 70 generates a clock signal with a period T3 (>T1). The operations of the flip-flops 72 to 75 and NAND gate 76 are the same as with the second switching element 17 in an undriven state, so that description of the operations will be omitted in the following. When the second switching element 17 is in a driven state, the output of the comparator 22 becomes L level and, after passage of a predetermined time period T4, the first switching element 14 enters a driven state. The predetermined time period T4 is, for example, 14 to 15 msec.

As described above, in the present embodiment, in accordance with the gate drive signal for the second switching element 17, when the second switching element 17 is in a driven state (a high-load state), a long-period clock signal is generated and, when the second switching element 17 is in an undriven state (a low-load state), a short-period clock signal is generated. Therefore, the undriven time period (off time) of the first switching element 14 from when driving of the first switching element 14 is stopped due to overheating until when driving of the first switching element 14 is resumed can be made longer in the case where the second switching element 17 is in a driven state than that in the case where the second switching element 17 is in an undriven state.

Thus, the temperature of the second switching element 17 in a driven state, i.e. in normal operating condition, can be restricted from reaching the overheat detection temperature due to occurrence of a load short-circuit on the first switching element 14 side and being caused to enter an undriven state. This applies also when a load short-circuit occurs on the second switching element 17 side.

Though the configuration in which a counter is configured with the flip-flops 72 to 75 has been described, the number of stages of flip-flops is not particularly defined. Also, the configuration in which, using clock signals of different periods, the undriven time period of a first switching element with a second switching element in a driven state and the undriven time period of the first switching element with the second switching element in an undriven state are made different is not limited to the above example.

Fourth Embodiment

In describing a fourth embodiment, the description of parts identical to those of the semiconductor device 10 (temperature protection device) of the third embodiment will be omitted.

According to the third embodiment, a clock signal with a period T1 is generated, for example, when the gate drive signal for the second switching element 17 is at L level and a clock signal with a period T3 (>T1) is generated, when the gate drive signal for the second switching element 17 is at H level. In other words, in the third embodiment, the clock period is fixed at a predetermined value corresponding to the level of the gate drive signal.

In the present embodiment, the switching elements 14 and 17 are PWM-controlled. For example, the clock generation circuit 70 generates a clock signal based on the duty ratio of the gate drive signal for the second switching element 17 and using the current (drain current) flowing through the second switching element 17. That is, the clock signal is varied depending on the duty ratio and the current. Since, as stated above, the switching element 14 and 17 are PWM-controlled in the present embodiment, the undriven state is a state with a duty ratio of 0% and the driven state is a state of being driven with a predetermined duty ratio. The loaded condition of a switching element varies with the duty ratio. For example, the switching element is more heavily loaded when the duty ratio is 60% than when the duty ratio is 30%.

Figure 8:
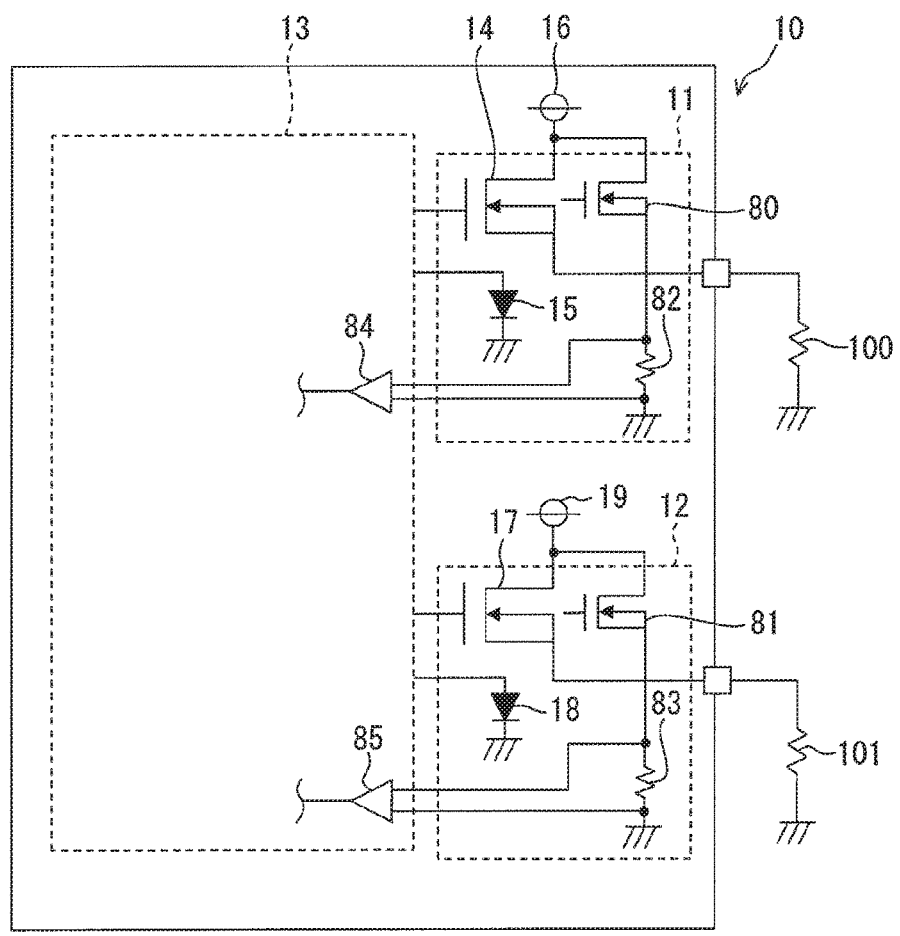
FIG. 8 is a diagram showing an outline configuration of a semiconductor device applied with a temperature protection device according to a fourth embodiment.

FIG. 8 shows an outline configuration of the semiconductor device 10 according to the present embodiment that is similar to the semiconductor device 10 of the third embodiment. Relative to the semiconductor device 10 of the third embodiment, the semiconductor device 10 of the present embodiment additionally includes sense elements 80 and 81, resistors 82 and 83 for current detection and operational amplifiers 84 and 85. In FIG. 8, the circuit elements other than the operational amplifiers 84 and 85 of the semiconductor chip 13 are omitted.

In the semiconductor chip 11, the sense element 80 and the resistor 82 are formed to detect current flowing through the first switching element 14. A current proportional to the amount of current flowing through the first switching element 14 flows through the sense element 80. The resistor 82 is connected to the sense element 80 to be on the ground side of the sense element 80. The resistor 82 is disposed such that the voltage across the resistor 82 corresponds to the amount of current flowing through the sense element 80.

In the semiconductor chip 12, the sense element 81 and the resistor 83 are formed to detect current flowing through the second switching element 17. A current proportional to the amount of current flowing through the second switching element 17 flows through the sense element 81. The resistor 83 is connected to the sense element 81 to be on the ground side of the sense element 81. The resistor 83 is disposed such that the voltage across the resistor 83 corresponds to the amount of current flowing through the sense element 81.

The semiconductor chip 13 includes the operational amplifiers 84 and 85. The operational amplifier 84 amplifies the voltage across the resistor 82 to a voltage corresponding to the amount of current flowing through the first switching element 14 and outputs the amplified voltage. The output of the operational amplifier 84 is inputted to a CLK generation circuit, not shown, disposed on the second switching element 17 side. The operational amplifier 85 amplifies the voltage across the resistor 83 to a voltage corresponding to the amount of current flowing through the second switching element 17 and outputs the amplified voltage. The output of the operational amplifier 85 is inputted to a clock generation circuit 70, shown in FIG. 9, disposed on the first switching element 14 side. Thus, a current detection device is configured with the sense elements 80 and 81, resistors 82 and 83 and operational amplifiers 84 and 85.

Figure 9:
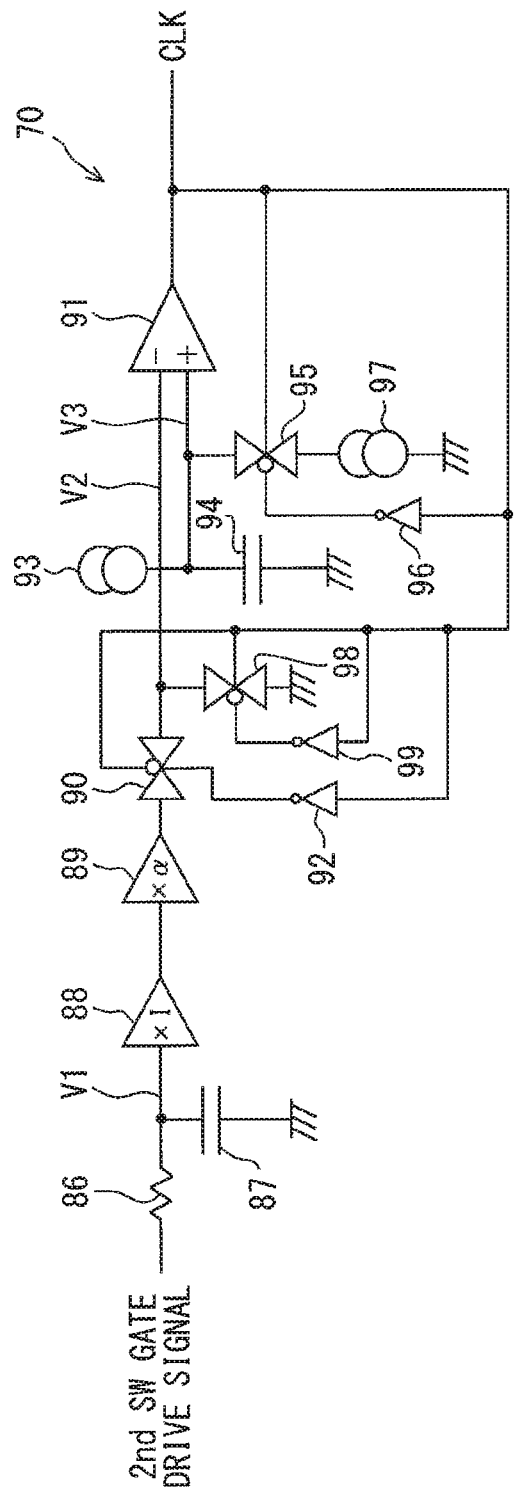
FIG. 9 is a diagram showing an outline configuration of a clock generation circuit.

FIG. 9 shows the clock generation circuit 70 disposed on the first switching element 14 side of the semiconductor device 10 of the present embodiment. In FIG. 9, the gate drive signal for the second switching element 17 is denoted as "2nd SW gate drive signal." The clock generation circuit on the second switching element 17 side is also similarly configured.

The clock generation circuit 70 includes a resistor 86, capacitors 87 and 94, operational amplifiers 88 and 89, transfer gates 90, 95 and 98, comparator 91, NOT gates 92, 96 and 99 and constant-current sources 93 and 97.

A smoothing filter is formed of the resistor 86 and the capacitor 87. An amplifier circuit is formed of the operational amplifiers 88 and 89. An oscillator circuit is formed of transfer gates 90, 95 and 98, comparator 91, NOT gates 92, 96 and 99 and constant-current sources 93 and 97.

The gate drive signal (PWM signal) for the second switching element 17 is smoothed by the smoothing filter formed of the resistor 86 and capacitor 87 and is inputted to the amplifier circuit. As shown in FIG. 9, the voltage of the signal coming through the smoothing filter is denoted as "V1." The amplifier circuit is formed of the two operational amplifiers 88 and 89. The front-stage operational amplifier 88 amplifies the smoothed gate drive signal based on the output of the foregoing operational amplifier 85. That is, the operational amplifier 88 amplifies the smoothed gate drive signal by multiplying the signal by current I (equivalent voltage) flowing through the second switching element 17.

The signal amplified at the operational amplifier 88 is further amplified, by being multiplied by α, at the operational amplifier 89 so as to make the signal level easier to handle. The signal thus amplified is inputted to the transfer gate 90. The operational amplifier 89 is to be used as required. A configuration without the operational amplifier 89 may also be used.

As in the first embodiment, the transfer gates 90, 95 and 98 are CMOS-type transfer gates. The p-channel side gate of the transfer gate 90 receives the output signal of the comparator 91 and the n-channel side gate receives the signal inverted at the NOT gate 92. When the output signal of the comparator 91 is at L level, the transfer gate 90 turns on and inputs the output of the operational amplifier 89 to the inverting input terminal of the comparator 91. When, on the other hand, the output signal of the comparator 91 is at H level, the transfer gate 90 turns off and the connection between the output terminal of the operational amplifier 89 and the inverting input terminal of the comparator 91 is broken. The voltage inputted to the inverting input terminal of the comparator 91 is denoted as "V2."

The capacitor 94 is connected between the constant-current source 93 and ground and the positive-side terminal of the capacitor 94 is connected to the non-inverting input terminal of the comparator 91. The voltage inputted to the non-inverting input terminal of the comparator 91 is denoted as "V3." The comparator 91 compares voltages V2 and V3 and outputs the comparison result as a clock signal. The clock signal is, as described in connection with the third embodiment, inputted to the first-stage flip-flop 72 via the AND gate 71 (see FIG. 5).

The constant current source 93 supplies a predetermined current I1. The non-inverting input terminal of the comparator 91 is connected with the transfer gate 95. The n-channel side gate of the transfer gate 95 receives the output signal of the comparator 91 and the p-channel side gate receives the signal inverted at the NOT gate 96. When the output signal of the comparator 91 is at L level, the transfer gate 95 turns off and, when the output signal of the comparator 91 is at H level, the transfer gate 95 turns on.

The constant-current source 97 is connected between the transfer gate 95 and ground. The constant-current source 97 supplies a current two times the current I1 (2×I1) supplied by the constant-current source 93. When the transfer gate 95 turns on, the constant current source 97 is connected to the non-inverting input terminal of the comparator 91.

The n-channel side gate of the transfer gate 98 receives the output signal of the comparator 91 and the p-channel side gate receives the signal inverted at the NOT gate 99. When the output signal of the comparator 91 is at L level, the transfer gate 98 turns off and, when the output signal of the comparator 91 is at H level the transfer gate 98 turns on. When the transfer gate 98 turns on, the inverting input terminal of the comparator 91 is connected to ground.

Next, based on FIG. 10, effects generated by the clock generation circuit 70 shown in FIG. 9 will be described.

Figure 10:
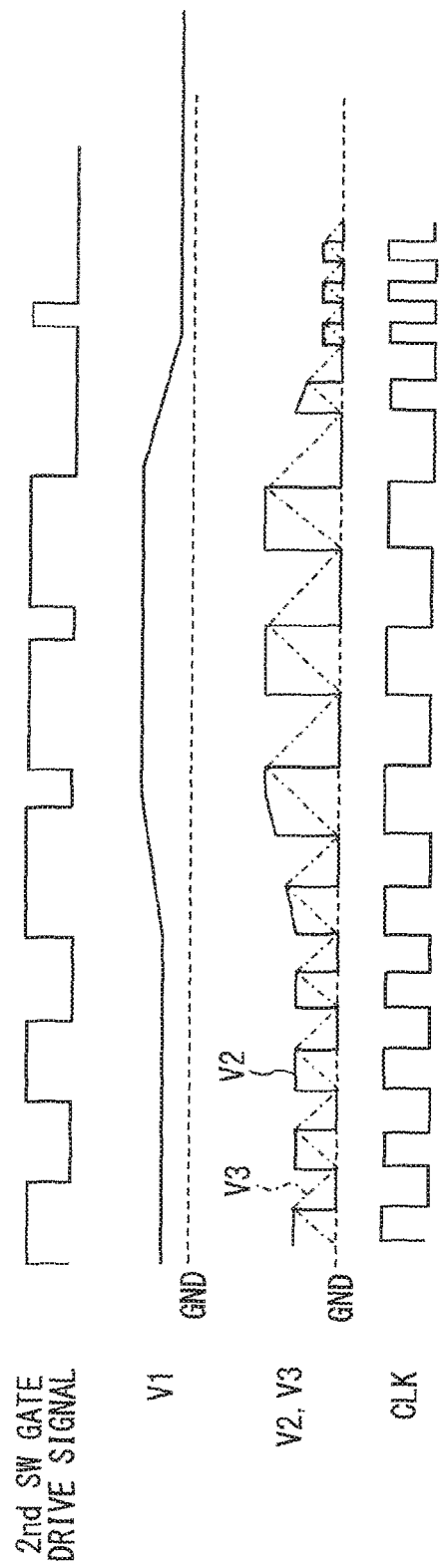
FIG. 10 is a timing chart representing operation of the clock generation circuit.

FIG. 10 is a timing chart representing operation of the clock generation circuit 70 and illustrates the gate drive signal (PWM signal) for the second switching element 17, the foregoing voltages V1, V2 and V3, and a clock signal. In FIG. 10, the gate drive signal for the second switching element 17 is denoted as "2nd SW gate drive signal" and the clock signal is denoted as "CLK." In FIG. 10, the voltage V3 is represented by a dot and dash line.

The gate drive signal for the second switching element 17 is smoothed by the foregoing resistor 86 and capacitor 87 to be as represented as voltage V1 in FIG. 10. Where the duty ratio of the gate drive signal is high, the value of voltage V1 is high.

When the output signal of the comparator 91 is at L level, the transfer gate 90 turns on and the transfer gates 95 and 98 turn off. This causes the voltage V2 inputted to the inverting input terminal of the comparator 91 to assume a voltage value obtained by amplifying voltage V1 at the operational amplifiers 88 and 89. On the other hand, as a result of turning off of the transfer gate 95 the voltage V3 inputted to the non-inverting input terminal of the comparator 91 is caused to rise by the constant-current source 93 and the capacitor 94. When, subsequently, the voltage V3 reaches the voltage V2 (output of the operational amplifier 89), the output signal of the comparator 91 switches to H level.

When the output signal of the comparator 91 becomes H level, the transfer gate 90 turns off and the transfer gates 95 and 98 turn on. As a result, the connection between the operational amplifier 89 and the comparator 91 is broken and the inverting input terminal of the comparator 91 is connected to ground via the transfer gate 98. That is, the voltage V2 equals the ground (GND) potential. As a result of turning off of the transfer gate 95, the constant-current source 97 is connected to the non-inverting input terminal of the comparator 91 and the voltage V3 drops. In the present embodiment, the current supplied by the constant-current source 97 is two times the current I1 supplied by the constant-current source 93, so that, as shown in FIG. 10, the gradient of variation of the voltage V3 from ground to voltage V2 is the same as the gradient of variation of the varied voltage V3 from voltage V2 to ground.

When the voltage V3 drops below the voltage V2 (ground potential), the output signal of the comparator 91 again becomes L level. Thus, the output signal of the comparator 91 alternates between L level and H level. In the above configuration in which the output signal of the comparator 91 is outputted as a clock signal to the flip-flop 72, when the duty ratio of the gate drive signal for the second switching element 17 is higher, the clock signal period is longer. Also, the operational amplifier 88 amplifies the gate drive signal by multiplying the gate drive signal by the current flowing through the second switching element 17, so that a high electrical current flows. That is, when the load is higher, the clock period is longer.

As described above, in the present embodiment, the undriven time period T4 (T2) of the first switching element 14 set in the third embodiment is determined by the product of the duty ratio of the gate drive signal for the second switching element 17, amplification degree I of the operational amplifier 88 and amplification degree a of the operational amplifier 89. In other words, the undriven time period is proportional to the product of the duty ratio of the second switching element 17 and the current flowing through the second switching element 17. Therefore, the undriven time period of the first switching element 14 can be made longer when the second switching element 17 is in a driven state than when the second switching element 17 is in an undriven state. That is, the undriven time period of the first switching element 14 varies depending on the load of the second switching element 17. The undriven time period of the first switching element 14 is longer when the second switching element 17 is in a high load state than when the second switching element 17 is in a low load state.

Thus, the temperature of the second switching element 17 in a driven state, i.e. in normal operating condition, can be restricted from reaching the overheat detection temperature for the second switching element 17 due to occurrence of a load short-circuit on the first switching element 14 side and being caused to enter an undriven state. This applies also when a load short-circuit occurs on the second switching element 17 side.

In the present embodiment, the voltage V2 switches between the voltage after amplification at the operational amplifiers 88 and 89 and the ground potential. However, the ground potential may be replaced by an optional voltage lower than the voltage after amplification at the operational amplifiers 88 and 89.

Embodiments of the present disclosure have been described, but the present disclosure is not limited at all to the above embodiments and can be modified in various ways without departing from the spirit and scope of the present disclosure.

In the above embodiments, the semiconductor device 10 includes the three semiconductor chips 11, 12 and 13. The elements of the semiconductor chips 11 and 12 may be formed on a same chip. Also, the elements configuring the semiconductor chips 11, 12 and 13 may be formed on a same chip.

In the above embodiments, the semiconductor chip 13 is formed in a same package as the semiconductor chips 11 and 12, i.e. as the switching elements 14 and 17, but the semiconductor chip 13 may be outside the package as long as the switching elements 14 and 17 are in the same package.

In the above embodiments, the control device is configured with circuit elements (hardware) of the semiconductor chip 13, but the control device may be formed of software using a microcomputer.

In the above embodiments, the two switching elements 14 and 17 are used, but the disclosure can also be applied to three or more switching elements.

A filter circuit for noise suppression may be disposed downstream of the OR gates 35 and 55 in the first embodiment, the comparator 22 in the second embodiment or the NAND gate 76 in the third embodiment.

In the above embodiments, the switching elements 14 and 17 are disposed on the high side with respect to the loads 100 and 101, respectively, but the switching elements 14 and 17 may be disposed on the low side.

The thermosensors 15 and 18 may be other than diodes, for example, thermistors.

While the present disclosure has been described in accordance with the above embodiments, it is understood that the present disclosure is not limited to the above embodiments and structures. The present disclosure embraces various changes and modifications within the range of equivalency. In addition, various combinations and modifications and other combinations and modifications including only one element or more or less than one element are within the scope and sprit of the present disclosure.

The invention claimed is:

1. A temperature protection device for a plurality of switching elements included in a same package, the temperature protection device comprising:
a plurality of temperature detection devices detecting temperatures of the switching elements; and a control device controlling the switching elements, the control device having an overheat detection temperature and a return temperature for each of the switching elements, the overheat detection temperature being for detecting an overheated state of a corresponding switching element, the return temperature being for resuming driving of a corresponding switching element driving of which has been stopped due to overheating, the control device stopping driving of a first switching element when the temperature of the first switching element from among the plurality of the switching elements rises to the corresponding overheat detection temperature, and resuming the driving of the first switching element when the temperature of the first switching element drops to the corresponding return temperature, wherein
the control device controls timing of resuming the driving of the first switching element such that an undriven time period of the first switching element is longer when at least one of the switching elements other than the first switching element is in a high load state when the temperature of the first switching element reaches the corresponding overheat detection temperature than an undriven time period of the first switching element when all the switching elements other than the first switching element are in a low load state when the temperature of the first switching element reaches the corresponding overheat detection temperature, the undriven time period being a time period from a time the driving of the first switching element is stopped due to overheating to a time the driving of the first switching element is resumed.

2. The temperature protection device according to claim 1, wherein
the control device has, as the return temperature, a first return temperature and a second return temperature being lower than the first return temperature, the first return temperature being for comparison with the temperature of the first switching element, the second return temperature being for comparison with the temperature of each of the switching elements other than the first switching element, and
the control device resumes the driving of the first switching element when the temperature of the first switching element drops to or below the first return temperature and the temperatures of all the switching elements other than the first switching element drop to or below the second return temperature.

3. The temperature protection device according to claim 1, wherein
based on a drive signal for operating each of the switching elements other than the first switching element, the control device controls timing of resuming the driving of the first switching element such that the undriven time period of the first switching element differs between when at least one of the switching elements other than the first switching element is in the high load state and when all the switching elements other than the first switching element are in the low load state.

4. The temperature protection device according to claim 3, wherein
the control device resumes the driving of the first switching element when a predetermined period of time elapses after dropping of the temperature of the first switching element to the return temperature.

5. The temperature protection device according to claim 4, further comprising a current detection device to detect a current flowing through each of the switching elements, wherein
the control device PWM-controls each of the switching elements and sets, as the predetermined period of time, a period of time proportional to a product of the current flowing through each of the switching elements other than the first switching element and a duty ratio of a gate drive signal for each of the switching elements other than the first switching element.

6. The temperature protection device according to claim 3, wherein the control device has, as the return temperature, a third return temperature and a fourth return temperature, the third return temperature being set when all the switching elements other than the first switching element are off in the low-load state, the fourth return temperature being set when at least one of the switching elements other than the first switching element is in the high-load state and being lower than the third return temperature, and the control device causes the driving of the first switching element to be resumed when, with at least one of the switching elements other than the first switching element being on, the temperature of the first switching element drops to the fourth return temperature.

* * * * *